Nov. 14, 1967 J. P. KITCHEN ETAL 3,353,064

HIGH POWER PULSE MODULATOR

Filed Dec. 30, 1964 3 Sheets-Sheet 1

INVENTORS
JAMES P. KITCHEN
DAVID C. DePACKH
HAROLD R. D. ROESS
THOMAS J. O'CONNELL

BY

ATTORNEY

INVENTORS
JAMES P. KITCHEN
DAVID C. DePACKH
HAROLD R. D. ROESS
THOMAS J. O'CONNELL
BY [signature]
ATTORNEY INVENTORS
JAMES P. KITCHEN
DAVID C. DePACKH
HAROLD R. D. ROESS
THOMAS J. O'CONNELL BY [signature]

ATTORNEY

United States Patent Office 3,353,064
Patented Nov. 14, 1967

3,353,064

HIGH POWER PULSE MODULATOR

James P. Kitchen, Fort Washington Estates, and David C. De Packh, Oxon Hill, Md., Harold R. D. Roess, Washington, D.C., and Thomas J. O'Connell, Clinton, Md., assignors to the United States of America as represented by the Secretary of the Navy Filed Dec. 30, 1964, Ser. No. 422,463
2 Claims. (Cl. 315—239)

The invention described herein may be manufactured and used by or for the Government of the United States of America for governmental purposes without the payment of any royalties thereon or therefore.

The present invention relates to a pulse modulator and more particularly to a spark-gap type pulse modulator for producing high power pulses.

Those concerned with the development of electronic devices requiring high-current, high-voltage inputs have long recognized the need for a modulator which produces a high power pulse having fast rise and fall times. Electron guns have been developed which require a 1000 ampere input at 550 kilovolts. Consequently a pulse modulator is required which provides an output pulse with a peak power on the order of 550 megawatts.

Prior art pulse modulators comprise pulse forming networks of several independent sections wherein the capacitors are bulky and have relatively large internal inductance. The pulse transformer usually employed has a multiple turn primary and a low step-up voltage ratio. Large step-up ratios are seldom used in pulse transformers because the gain can be obtained only by sacrificing the rise time. This is due to the fact that the distributed capacity referred to the primary varies as the square of the turns ratio, $n$. Low step-up voltage ratios impose high D.C. voltage requirements on the capacitors thereby increasing breakdown problems. The present modulator was designed to partially overcome these restrictions by minimizing the transformer leakage inductance, the inductance of connecting leads, and the internal inductance of the network capacitors. A further innovation is the incorporation of the transformer leakage inductance as one of the network components.

The general purpose of this invention is to provide a pulse modulator for providing a high power output pulse of the order of 550 megawatts with rise and fall times of less than 1 microsecond. To attain this, a pulse modulator was developed which includes a compact capacitor section having low internal inductance coupled to a transformer having a single turn primary and tapered secondary and a spark-gap type switch which is externally triggered.

An object of the present invention is the provision of a high power pulse modulator.

Another object is to provide a high power pulse modulator for producing an output pulse having very fast rise and fall times.

A further object of the invention is the provision of a pulse forming network having a minimum amount of stray inductance.

Still another object is to provide a high step-up voltage ratio with minimum problems due to voltage breakdown.

Other objects and many of the attendant advantages of this invention will be readily appreciated as the same becomes better understood by reference to the following detailed description when considered in connection with the accompanying drawings in which like references numerals designate like parts throughout the figures thereof and wherein:

FIG. 4($b$) is an equivalent circuit of the transformer.

Figure 1:
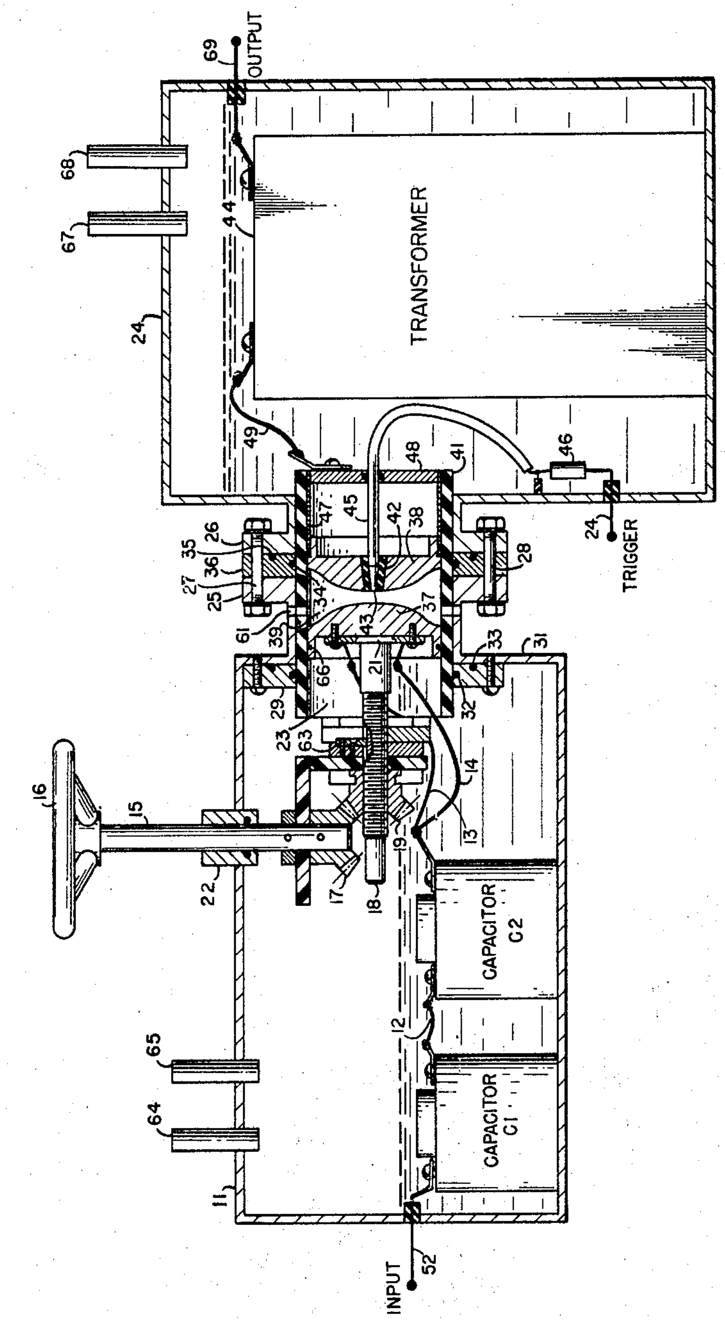
FIG. 1 is a cross-sectional view of the modulator of this invention.

Referring now to the drawings, wherein like reference characters designate like or corresponding parts throughout the several views, there is shown in FIG. 1 a cross-sectional view of the modulator of this invention comprising a vacuum-tight capacitor housing 11 containing capacitors C1 and C2. These capacitors are charged from an external source 51 (FIG. 2) through resistor 53 and lead 52 and are connected together in parallel by a braid 12, and to anode 37 by braids 13 and 14. Capacitor housing 11 also contains a grooved bakelite rod 18 driven by internally threaded bevel gear 19 and attached to anode 37 by plate 21 which is fastened to rod 18. Rod 18 has a channel along its length for receiving key 63 to prevent rod 18 and anode 37 from rotating. Bevel gear 19 is in turn driven by bevel gear 17 which is fixed to a bakelite shaft 15 having a wheel 16 fixed thereto at the end opposite bevel gear 17. Also mounted in capacitor housing 11 is bracket assembly 62 for supporting the gearing and shaft 15 together with rod 18. A seal 22 surrounds shaft 15 at the point adjacent the top side of housing 11 to provide a fluid tight seal.

The lid of capacitor housing 11 has an evacuating pipe 64 which is connected to a vacuum pump when housing 11 is to be evacuated in order to insure complete removal of air pockets prior to immersing the capacitors with oil through pipe 65. Likewise, transformer housing 24 has an evacuating pipe 67 and filler pipe 68 for immersing the transformer in transformer insulating oil.

A cylindrical spark-gap housing 23, essentially comprised by polyethylene sleeve 41, connects capacitor housing 11 with vacuum-tight transformer housing 24 which contains transformer 44. Both housing 11 and housing 24 have mating flanges 25 and 26 which are tightly engaged by bolts 27 and 28. Around the spark-gap housing 23 and within the capacitor housing 11 is a circular plate 29 bolted to the wall 31 of housing 11. O-rings 32 and 33 are held in a sealing engagement by means of plate 29 while O-rings 34 and 35 are held in sealing engagement by circular plate 36 which is positioned around spark-gap housing 23 between flanges 25 and 26. An O-ring 66 is employed to produce a fluid-tight seal about the periphery of anode 37. Vents 61, located about the periphery of spark-gap housing 23, serve to prevent excessive pressure from forming in the spark-gap area and also serve as exhaust ports for potentially corrosive gases.

Within spark-gap housing 23 and in sliding engagement therewith is anode 37 which, together with cathode 38 defines spark-gap 39. The width of spark-gap 39 is adjustable by means of spark-gap adjusting wheel 16. Also within spark-gap housing 23 is a trigger electrode comprising copper pin 43 soldered to the end of lead 45 and encased in a ceramic sleeve 42 within the cathode 38 and coupled through resistor 46 to an external triggering device 54 (shown in FIG. 2) by lead 24. Gap breakdown is accomplished by adjusting the spacing of the gap just beyond that at which breakdown without triggering occurs and then applying a fast-rising positive pulse to the trigger electrode through lead 45. Any conventional variable frequency pulse generator that can provide relatively fast rising pulses of sufficient voltage to the electrode may be employed as the trigger device. Cathode 38 is at a large negative potential with respect to anode 37 so that a relatively low trigger voltage will produce breakdown of the gap. Since isolation of the trigger generator from the charged network is necessary when gap breakdown occurs, a resistor 46 is connected in series with trigger lead 45. A conductive cylindrical sheet 47 within housing 23 is connected to conducting disc 48 and conducts current from cathode 38 through disc 48 and lead 49 to the single turn primary winding 55 (shown schematically in FIG. 2) of transformer 44. Additional connections between conducting disc 48 and the transformer primary may be provided in order to reduce lead inductance.

Figure 2:
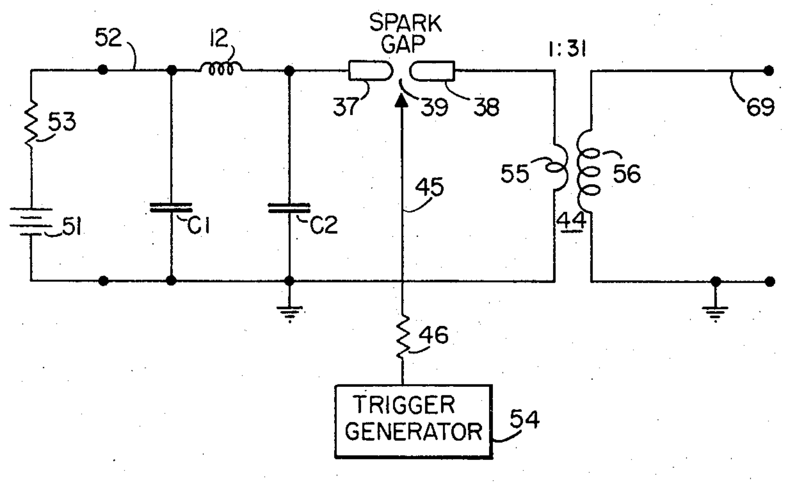
FIG. 2 is a circuit diagram of the modulator.

FIG. 2 illustrates a circuit diagram of the invention including capacitors C1 and C2, which are housed in capacitor housing 11 (FIG. 1), spark gap 39, transformer 44 having one end of its single-turn primary 55 connected to cathode 38 and the other end grounded. Multiple-turn secondary 56 has one end grounded and the other end 69 providing the modulator output. A voltage source 51 is connected to charge capacitors C1 and C2 through resistor 53 and lead 52. These capacitors are connected in parallel by inductive braid 12 and to anode 37. A trigger generator 54 is serially connected to isolation resistor 46 and lead 45 for triggering gap breakdown.

Figure 3:
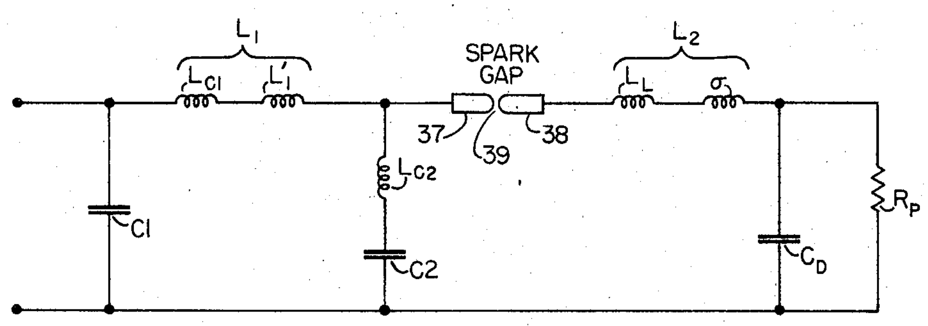
FIG. 3 is an equivalent circuit of the modulator.

FIG. 3 is an equivalent circuit of the modulator (excluding the charging source and trigger generator) wherein the pulse forming network has two sections, with $C_1$ and $L_1$ in one section and $C_2$ and $L_2$ in the second section. $C_1$ and $C_2$ represent capacitors C1 and C2 of FIG. 2, $L_1'$ is the inductance of the braid 12 connection between $C_1$ and $C_2$, $L_{C1}$ and $L_{C2}$ are the internal inductances of $C_1$ and $C_2$, respectively, while $L_2$ comprises the transformer leakage inductance $\sigma$ and $L_L$ is the inductance of the connecting leads. $C_D$ is the distributed capacity of the transformer referred to the primary and $R_P$ is the reflected primary impedance equal to $R_L/n^2$, where $n$ is the step-up ratio and $R_L$ is the load resistance at the output of the transformer. For networks whose values for $L_1$ and $L_2$ are quite small the internal inductances $L_{C1}$ and $L_{C2}$ are not negligible, and their effect on pulse shape must be considered.

A conventional digital differential analyzer may be employed to solve the differential equations derived from the equivalent circuit of FIG. 3 and to plot their solutions in the form of a curve. This curve can then be compared to the experimental pulse shape as observed on an oscilloscope, and the parameter values can be adjusted until the two curves agree. This method reveals that the internal inductance of $C_2$, $L_{C2}$, has considerable influence on the pulse shape. Simple theoretical investigations indicate an optimum pulse shape for a 4/3 ratio of $C_1/C_2$, whereas experimental and computer studies indicate that a larger ratio is required, dependent on the value of $L_{C2}$.

Factors which determined the pulse length and the high-voltage stand-off ability of the transformer are interdependent. For a two-section pulse former as shown in FIG. 3, the length of the pulse at the base is given by $t_o=(3/2)\sqrt{L_2C_1}$ and the network impedance by $Z_o=L_2/C_1$. Since the reflected primary impedance of $R_P$ is the small value $R_L/n^2$, then in order to match $Z_o$ to $R_P$, either $L_2$ must be small or $C_1$ must be large. But an increase in $C_1$ will increase the pulse length, which is undesirable. $L_2$ must therefore be reduced to the smallest possible value.

Figure 4A:
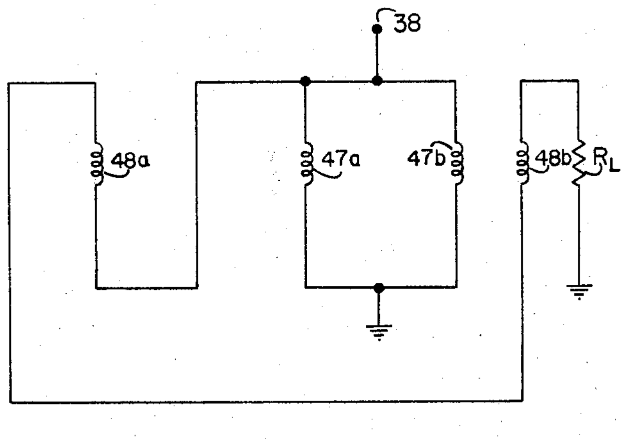
FIG. 4($a$) illustrates a modification of the transformer circuit.
Figure 4B:
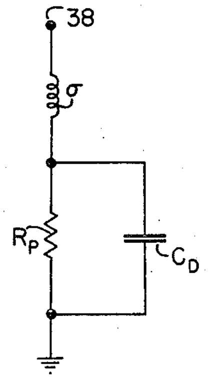

From the relationship $\sigma=(u_oN_P^2V)\lambda^2$, where $N_P$ is the number of primary turns, $u_o$ is the permeability of the core, V is the volume between windings, and $\lambda$ is the winding length, which is fixed by the core dimensions, it is seen that a reduction in $N_P^2V$ will give a reduced $\sigma$. It should be noted that the amount that V can be reduced is set by the breakdown threshold between windings. A further decrease in $\sigma$ can be achieved by the transformer arrangement shown in FIG. 4(*a*) where the split primary windings **47*a* and 47*b* are connected in parallel. The effective leakage inductance is thereby reduced by a factor of 2, since the leakage inductances of the individual windings ($\sigma_1$ and $\sigma_2$) are equal and $\sigma=\sigma_1\sigma_2/\sigma_1+\sigma_2$ becomes $\sigma=\sigma_{1/2}$ or $\sigma_{2/2}$. The transformer secondary 56 is illustrated as two serially connected inductances 48*a* and 48*b***. The equivalent circuit of the transformer is shown in FIG. 4(*b*).

Transformer 44 has a single turn primary 55 so that $N_P^2$ is at its lowest possible value. The secondary has 30 turns with an additional turn arising from the connection between the primary to the secondary as shown in FIG. 4(*a*). The secondary winding of the transformer has a tapered construction which is effective in reducing the volume between windings and consequently the leakage inductance. The transformer cores are made of 2-mil highly-grain-oriented silicon-steel Silectron. With a saturation flux density of 10,000 gauss, the unbiased cores will accommodate a pulse length of up to 1 microsecond at 550 kilovolts at the secondary before saturation occurs.

In order to have a short pulse length, a relatively short rise time should be obtained. The rise time response of a pulse transformer is proportional to $\sqrt{\sigma C_D}$ where $C_D$ is the distributed capacity of the transformer and is attributed to interwinding capacities resulting from the windings acting as parallel plates. In attempting to reduce interwinding volume to obtain a small $\sigma$, the capacity will increase and the rise time is thereby adversely affected. Also, since the interwinding capacity is multiplied by $n^2$, a large stepup ratio increases the rise time by the factor $n$. Consequently the only manner in which the product $\sigma C_D$ can be reduced is by reducing the factor $\sigma$. Another consideration with respect to $C_D$ is that an excessive $C_D$ will reduce the flatness of the pulse.

Experimental studies indicate that for a two-section pulse forming a network a ratio of $L_2/L_1=2/1$ will give a pulse having a substantially flat top. Since $L_2$ must be reduced to as small a value as possible as explained above, $L_1$ must also be very small so that $L_2=2L_1$ in accordance with the ratio above. Since $L_1$ includes the internal inductance of $C_1$, capacitors with a very small internal inductance must be used.

Capacitors C1 and C2 which meet the requirement of low internal inductance, high voltage stand-off, and proper spatial configuration are constructed of stacks of four sheets of silvered Mylar. The dielectric is Du Pont Mylar Type A polyester film having a conducting silver coating centered on both sides of each sheet. The high dielectric strength and dielectric constant of Mylar suggests its use in the construction of high-voltage, high-capacity capacitors with good life expectancy. By applying a conductive coating to each side of the Mylar sheet a capacity can be obtained which closely approaches the theoretical capacity. Since the dielectric strength decreases as thickness increases, it is desirable to select the minimum thickness of Mylar that can be coated easily and handled in large sheets. Stacking thin coated sheets gives a uniform voltage gradient, allowing one to take advantage of the higher breakdown strength of the thinner sheets. Since the thickness of the coating has to be consistent with good coverage and maximum current density, a sheet thickness of 0.0075 inch and a coating of 0.001 inch or slightly less of conducting silver will give the desired results. There is a border around the silver coating for corona suppression and avoidance of surface tracking when the capacitors are immersed in insulating fluid. Contact to the silver on each stack of four sheets is made by means of a sheet of copper foil which runs under the stack and extends beyond the edge at one side of the stack. Contact to the top of the stack is made in the same manner, but the foil runs at right angles to the first foil. As the stacks are assembled, the foil runs at right angles to the first foil and the foil strips on any one side come from every second stack. The stacks are connected in parallel by joining the ends. The first and last sheet of each orientation of foils are replaced by aluminum plates. Copper spaces are placed between adjacent foil sheets at each end so as to provide positive contact between foils. Brass bolts are run through the aluminum plates so that the copper spacers and the foils are all bound together to form a rigid assembly.

Capacitors C1 and C2 are contained in vacuum-tight aluminum tank 11 of FIG. 1, in which an insulating fluid such as Dow Corning Type 200 fluid is added. The described packaging method allows for the removal of all trapped air and its replacement with the insulating fluid. The tank is then hermetically sealed.

The aforedescribed pulse modulator produces a peak voltage of 500 kilovolts at 1,000 amperes. The output pulse has a flat top for 500 nanoseconds, a flatness of 1% for at least 200 nanoseconds, and a rise and fall time less than 500 nanoseconds.

Obviously many modifications and variations of the present invention are possible in the light of the above teachings. It is therefore to be understood, that within the scope of the appended claims, the invention may be practiced otherwise than as specifically described.

What is claimed and desired to be secured by Letters Patent of the United States is:

1. A pulse generator network comprising:

First and second capacitors connected in cascade;

A first sealed housing for enclosing and insulating said first and second capacitors;

Means for charging said first and second capacitors from the exterior of said first sealed housing;

A transformer having a single-turn primary and a multiple-turn secondary;

A second sealed housing for enclosing and insulating said transformer;

Means connecting said transformer secondary to the exterior of said second housing;

Anode means connected to said capacitors;

Anode adjustment means, located partially interiorly and partially exteriorly of said first housing, for varying the position of said anode means;

Cathode means electrically connected to said single-turn transformer primary, said cathode means being spaced from said variably positioned anode means to form a variable spark-gap;

A third vented housing containing said anode and cathode means, said third housing coupling said first housing to said second housing, the structural cooperation of said third housing, anode means and cathode means being such that said spark-gap is exposed to ambient conditions but the seals of said first and second housings are not disturbed, and Triggering means including a copper pin encased in a ceramic shield and connected to receive a triggering pulse and mechanically contained and supported in said cathode means for periodically increasing the potential difference between said anode means and said cathode means for causing breakdown of the air space between said anode means and said cathode means when said potential difference exceeds a given value.

2. The pulse generator network of claim 1 wherein the transformer leakage inductance together with the inductance resulting from the transformer connecting leads is approximately equal to twice the value of the internal inductance of said first capacitor together with the inductance given by the connection between said first and second capacitors.

References Cited

UNITED STATES PATENTS

| | | | |
|---|---|---|---|
| 2,400,456 | 5/1946 | Haine et al. | 315—100 |
| 2,412,893 | 12/1946 | Lee | 328—67 |
| 2,456,116 | 12/1948 | Enns | 315—237 |
| 3,163,782 | 12/1964 | Ross | 307—88.5 |

OTHER REFERENCES

Principles and Practice of Radar, by Penrose Publisher Whitefriars Press Ltd., 1950, p. 405 relied on, copy in Scientific Library.

JOHN W. HUCKERT, *Primary Examiner.*

J. D. CRAIG, *Assistant Examiner.*